United States Patent
Yamasaki

(10) Patent No.: US 8,288,659 B2
(45) Date of Patent: Oct. 16, 2012

(54) WIRING BOARD AND MANUFACTURING METHOD THEREOF

(75) Inventor: Tomoo Yamasaki, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 131 days.

(21) Appl. No.: 12/869,805

(22) Filed: Aug. 27, 2010

(65) Prior Publication Data

US 2011/0061916 A1 Mar. 17, 2011

(30) Foreign Application Priority Data

Sep. 14, 2009 (JP) ................. 2009-211368

(51) Int. Cl.
*H05K 1/02* (2006.01)

(52) U.S. Cl. .............. 174/259; 174/255; 174/262

(58) Field of Classification Search .......... None
See application file for complete search history.

(56) References Cited

U.S. PATENT DOCUMENTS

| | | | |
|---|---|---|---|
| 8,006,377 B2* | 8/2011 | En et al. ................. | 29/846 |
| 2002/0180064 A1* | 12/2002 | Hwan et al. ............. | 257/780 |
| 2004/0219341 A1* | 11/2004 | Kataoka et al. ......... | 428/209 |
| 2005/0224977 A1* | 10/2005 | Yoshimura et al. ..... | 257/751 |
| 2009/0188806 A1* | 7/2009 | Yamasaki et al. ...... | 205/122 |
| 2009/0200072 A1 | 8/2009 | Mizunaga et al. | |

FOREIGN PATENT DOCUMENTS

| | | |
|---|---|---|
| JP | 2003-218516 | 7/2003 |
| JP | 2009-188324 | 8/2009 |

* cited by examiner

*Primary Examiner* — Ishwarbhai Patel

(74) *Attorney, Agent, or Firm* — IPUSA, PLLC

(57) ABSTRACT

A wiring board includes a substrate having a surface made of an insulating resin. An adhesion layer is formed on the substrate. A wiring layer is formed on the adhesion layer. The adhesion layer is formed by a nitrided NiCu alloy containing nitrogen therein. A nitrogen content of the nitrided NiCu alloy is within a range from 1 atoms % to 5 atoms %.

5 Claims, 21 Drawing Sheets

US 8,288,659 B2

WIRING BOARD AND MANUFACTURING METHOD THEREOF

CROSS-REFERENCE TO RELATED APPLICATIONS

This application is based upon and claims the benefit of priority of the prior Japanese Patent Application No. 2009-211368, filed on Sep. 14, 2009, the entire contents of which are incorporated herein by reference.

FIELD

The present invention relates to a wiring board and, more particularly, to a wiring board provided with an adhesion layer between a wiring layer and an insulating layer.

BACKGROUND

In many conventional Cu wiring boards, an adhesion layer is provided between an insulating layer formed on a substrate and a Cu wiring layer formed on the insulating layer (for example, refer to Japanese Laid-Open Patent Application No. 2003-218516). The adhesion layer is provided to fix the Cu wiring layer so that the Cu wiring layer is not separated from the substrate.

A resin material is used as an insulating layer formed on a substrate in many cases. According to a type of a resin to be used, even an adhesion layer formed of CuN does not provide sufficient adhesion strength. If adhesion strength of the adhesion layer is insufficient, a separation may occur between the CuN adhesion layer and the resin insulating layer, which may result in separation of a Cu wiring layer together with the resin insulating layer. Thus, it is suggested to improve adhesiveness between the resin insulating layer and the adhesion layer by forming the adhesion layer by an NiCu alloy (for example, refer to Japanese Laid-Open Application No. 2009-188324).

However, even if an adhesion layer is formed by an NiCu alloy to improve adhesiveness between an insulating layer and an adhesion layer as suggested in the above-mentioned patent document, sufficient adhesiveness may not be obtained depending on a type of resin forming the insulating layer.

SUMMARY

It is a general object of the present invention to provide a wiring substrate and a manufacturing method thereof, in which the above-mentioned problems are eliminated.

A more specific object of the present invention is to provide a wiring board and a manufacturing method thereof, in which adhesion strength of an adhesion layer to an insulating layer is improved.

According to an aspect of the invention, a wiring board includes a substrate; an adhesion layer formed on the substrate; and a wiring layer formed on the adhesion layer, wherein the adhesion layer is formed by a nitrided NiCu alloy.

According to another aspect of the invention, a manufacturing method of a wiring board includes: preparing a substrate having a surface made of an insulating resin; forming an adhesion layer on the substrate by a nitrided NiCu alloy; and forming a wiring layer on the adhesion layer.

According to the above-mentioned invention, the adhesion layer, which is provided between the substrate and the wiring layer, is prevented from being exfoliated or separated from the substrate.

The object and advantages of the present invention will be realized and attained by means of the elements and combinations particularly pointed out in the appended claims.

It is to be understood that both the foregoing general description and the following detailed description are exemplary explanatory only and are not restrictive of the invention, as claimed.

DESCRIPTION OF EMBODIMENT(S)

Preferred embodiment of the present invention will be explained with reference to the accompanying drawings.

Figure 1:
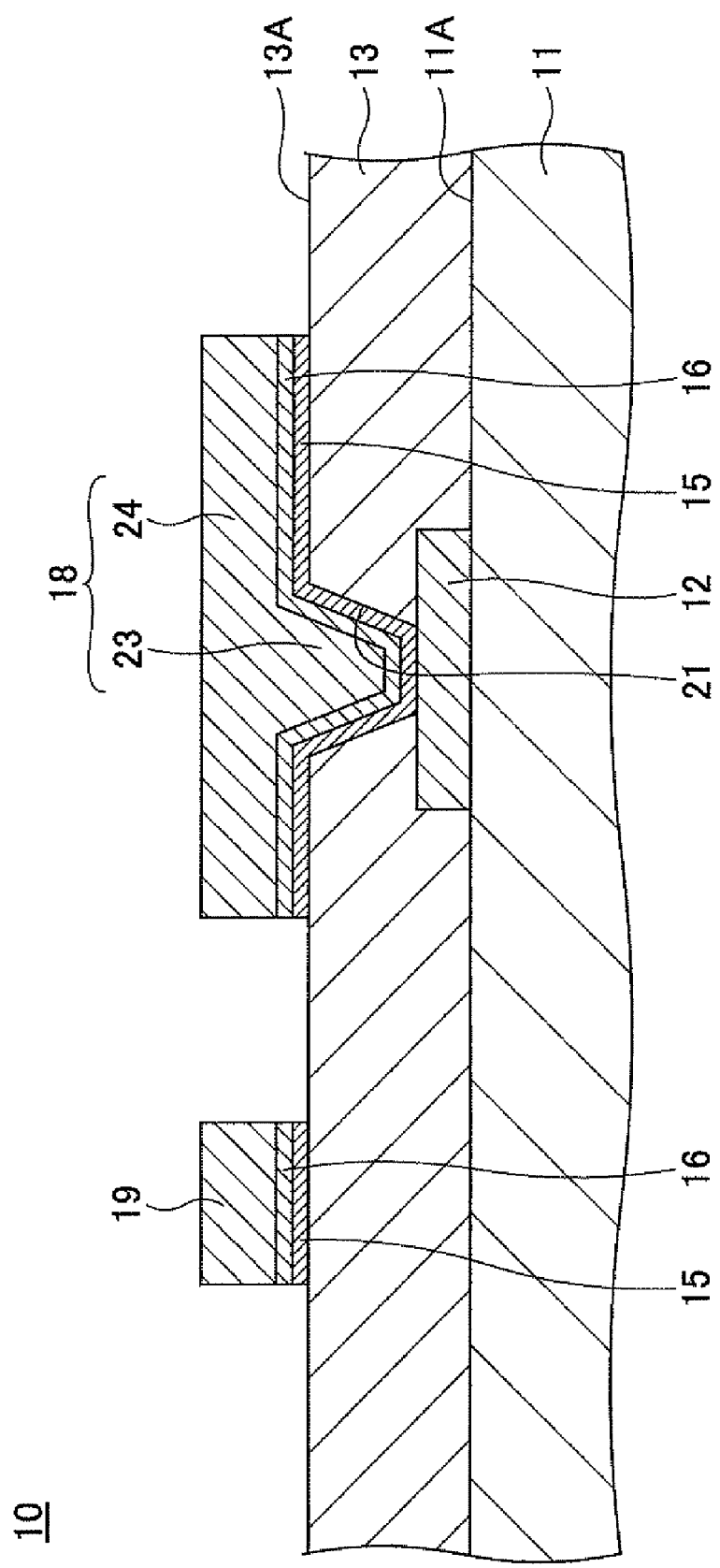
FIG. 1 is a cross-sectional view of a part of a wiring substrate according to an embodiment of the present invention.

FIG. 1 is a cross-sectional view of a part of a wiring board according to an embodiment of the present invention. The wiring board 10 according to the embodiment of the present invention includes a substrate body 11, a pad 12, an insulating layer 13, an adhesion layer 15, a seed layer 16, a circuit pattern 18, and wiring 19. The seed layer 16, the circuit pattern 18, and the wiring 19 together correspond to a wiring layer.

The pad 12 and the insulating layer 13 are formed on the substrate main part 11. As the substrate body 11, for example, a build-up substrate or a coreless substrate is used. The pad 12 is formed on a top surface 11A of the substrate body 11. The pad 12 is electrically connected with wiring and vias (not illustrated in the figure) provided in the substrate body 11.

The insulating layer 13 is formed on a top face 11A of the substrate body 11. A via hole 21 (opening) is formed in the insulating layer 13 so that an upper surface of the pad 12 is exposed on the bottom of the via hole 21. The via hole 21 is an opening provided to form a via 23, which is a part of the wiring pattern 18. As the insulating layer 13, for example, an insulated resin material such as an epoxy resin or a polyimide resin is used.

If the substrate body 11 is formed of an insulating resin material such as, for example, an epoxy resin or a polyimide resin, it is not necessary to form the insulating layer 13. In such a case, it can be interpreted that the insulating layer 13 is contained in the substrate body 11. Therefore, if the substrate body 11 is formed of an insulating resin material, the substrate body 11 corresponds to the substrate, and if the insulating layer 13 is formed on the substrate body 11, the combination of the substrate body and the insulating layer 13 corresponds to the substrate. The adhesion layer 15 is formed on the thus-formed substrate.

In the present embodiment, the adhesion layer 15 is formed on an upper surface 13A of the insulating layer 13 in an area where the wiring pattern 18 and the wiring 19 are formed. The adhesion layer 15 is also formed on a surface of the insulating layer, which corresponds to an inner surface of the via hole 21. Further, the adhesion layer 15 is formed on an upper surface of the pad 12, which surface is exposed in a bottom part of the via hole 21. The adhesion layer 15 is arranged between the insulating layer 13 and the seed layer 16. The adhesion layer 15 is formed of a material having excellent adhesiveness to the seed layer 16 and also to the insulating layer 13. If, for example, an epoxy resin substrate is used for the substrate body 11 as mentioned above, the insulating layer 13 is not formed but the adhesion layer 15 is formed directly on the substrate body 11.

In the present embodiment, the adhesion layer 15 is formed by a nitrided NiCu alloy. That is, the adhesion layer 15 is a thin film formed of a material which is made of an NiCu alloy containing nitrogen. The content of nickel in the adhesion layer 15 formed of a nitrided NiCu alloy is preferably set to 20 wt % or more. This can improve the adhesiveness between the adhesion layer 15 and the insulating layer 13. Because the adhesiveness between the insulating layer 13 and the adhesion layer 15 is improved by using a nitrided NiCu alloy having an Ni content of 20 wt % or more, the adhesion layer 15 is hardly separated from the insulating layer 13.

It is preferable to set a content of Ni in the nitrided NiCu alloy in a range, for example, from 20 wt % to 75 wt %. By setting the content of Ni in the nitrided NiCu alloy in a range from 20 wt % to 75 wt %, the adhesion layer 15 becomes hardly separable from the insulating layer 13. If, for example, a Cu layer is used for the seed layer 16, the adhesion layer 15 can be removed by etching using a Cu etchant (for example, a solution of sulfuric acid system), which is used for removing an unnecessary portion of the seed layer 16.

If the content of nickel in the nitrided NiCu alloy exceeds 75 wt %, it is difficult to remove the Ni—Cu alloy layer (the adhesion layer 15) by using the Cu etchant. If the content of Ni in the nitrided NiCu alloy is set within the range from 20 wt % to 75 wt %, a thickness of the adhesion layer 15 formed of the nitrided NiCu alloy, is preferably set to, for example, 30 nm to 100 nm.

In the present embodiment, the adhesion layer 15 is formed by a nitrided NiCu alloy, and, thus, the adhesion layer 15 contains nitrogen. The present inventor newly found that adhesion strength between the adhesion layer 15 and the resin layer 13 can be further improved by adding nitrogen to an NiCu alloy used as a material of the adhesion layer 15. It is preferable that the content of nitrogen in the NiCu alloy is set in a range from 0.5 to 5.0 atoms %. It is also preferable to set a weight ratio of Ni and Cu other than nitrogen to 1:2 (Ni:Cu-1:2).

The seed layer 16 is arranged to cover an upper surface of the adhesion layer 15. The seed layer 16 serves a power supply layer when forming the wiring pattern 18 and the wiring 19 according to an electroplating method. For example, a Cu layer is used for the seed layer 16. If a Cu layer is used as the seed layer 16, a thickness of the seed layer 16 is preferably set in a range, for example, from 300 nm to 500 nm.

If the circuit pattern 18 and the wiring 19 are formed according to a film-deposition method other than an electroplating method, the seed layer 16 serving as a power supply layer is unnecessary. Thus, a wiring layer forming the circuit pattern 18 and the wiring 19 may be formed directly on the adhesion layer 15.

The circuit pattern 18 includes a via 23 and a wiring 24 integrally formed with an upper portion of the via 23. The via 23 is provided on the seed layer 16 formed in the via hole 21. Cu may be used as a material of the circuit pattern 18. The circuit pattern 18 is electrically connected to the pad 21 through the adhesion layer 15 and the seed layer 16.

The wiring 19 is provided on an upper surface of the seed layer 16, which is arranged at a position separate from the wiring pattern 18. For example, Cu may be used as a material of the wiring 19.

According to the wiring board of the present embodiment, the adhesion layer 15 is hardly separated from the insulating layer 13 because the adhesiveness between the insulating layer 13 and the adhesion layer 15 is improved by using an NiCU alloy having a nitrogen content of 0.5 atoms % to 5.0 atoms % (0.5-5.0 atoms %) as a material of forming the adhesion layer 15, which is arranged between the insulating layer 13 and the seed layer 16.

Moreover, the adhesion layer 15 is hardly separated from the insulating layer 13 by setting the Ni content in the adhesion layer 15 within a range of 20 wt % to 75 wt %. Further, the adhesion layer 15 can be removed by etching using, for example, a Cu etchant (for example, a solution of sulfuric acid system).

A description will be given below, with reference to FIG. 2 through FIG. 8, of a manufacturing method of the above-mentioned wiring board. FIG. 2 through FIG. 8 are cross-sectional views illustrating a manufacturing process of the wiring board 10 illustrated in FIG. 1. In this manufacturing process, Cu wiring is formed according to an additive method.

Figure 2:
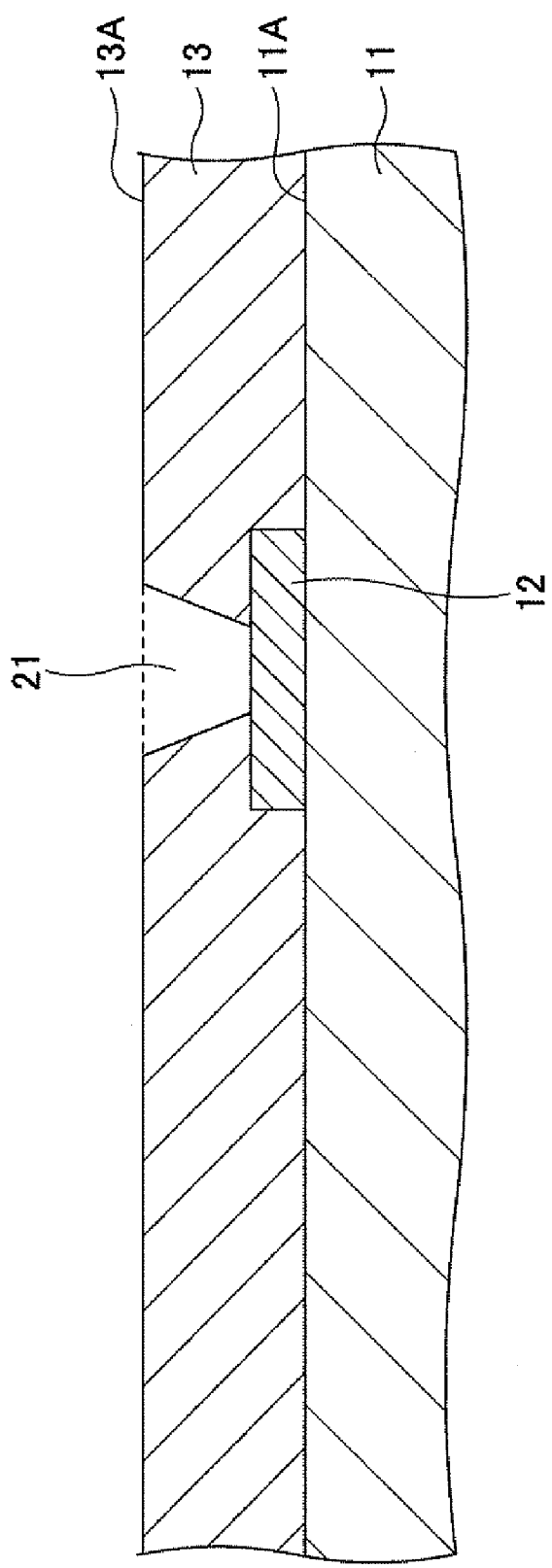
FIG. 2 is a cross-sectional view illustrating an insulating layer forming process.

First, in an insulating layer forming process illustrated in FIG. 2, the pad 12 and the insulating layer 13 having the opening part 21 are formed sequentially on the upper surface 11A of the substrate body 11 according to a known method. Thereafter, the upper surface of the insulating layer 13 and a surface of the insulating layer 13 to form the opening part 21 are cleaned (removing a water component, etc.).

As the substrate body 11, a substrate such as, for example, a build up substrate with a core or a careless substrate may be used. The pad 12 can be formed by, for example, a subtractive method, a semi additive method, etc. Cu may be used as a material of the pad 12. The insulating layer 13 is formed by sticking a half-cured insulating resin sheet made of an epoxy resin, a polyimide resin, etc., onto the upper surface 11A of the substrate body 11 on which the pad 12 is formed, and curing the half-cured insulating resin sheet.

Figure 3:
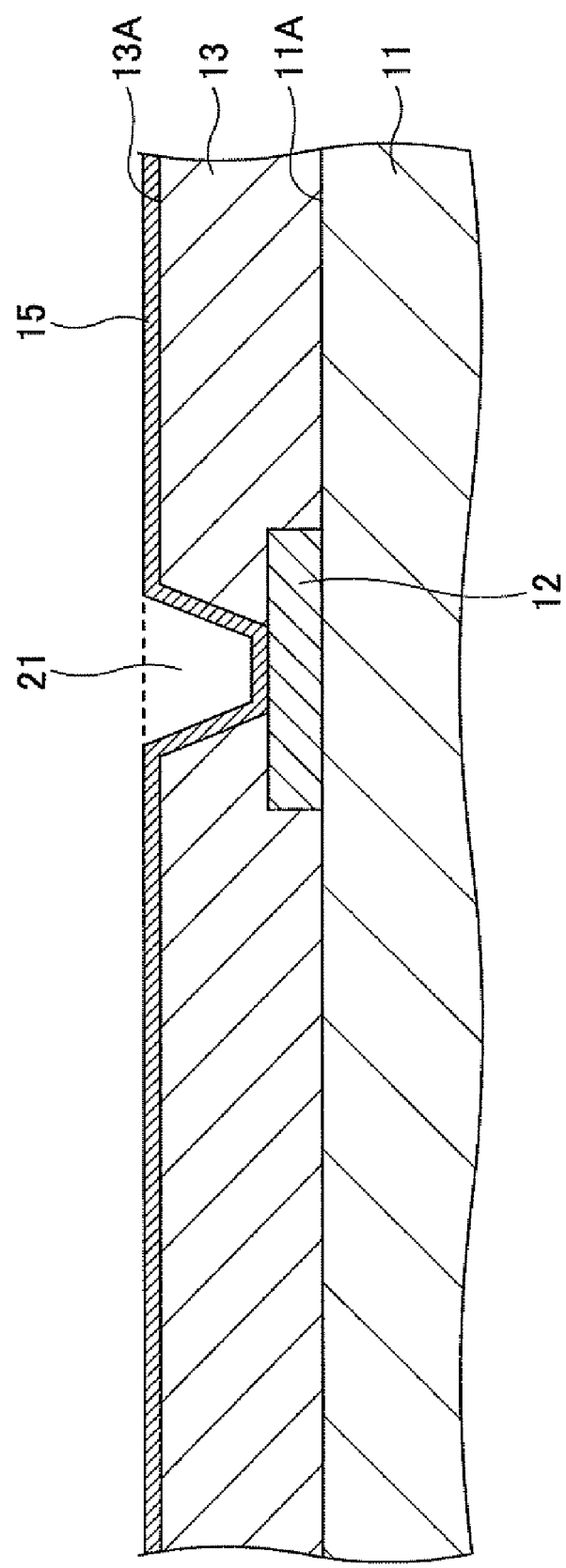
FIG. 3 is a cross-sectional view illustrating an adhesion layer forming process.

Then, in an adhesion layer forming process illustrated in FIG. 3, the adhesion layer is formed by a nitrided NiCu alloy to cover the upper surface 13A of the insulating layer 13, the surface of the insulating layer 13 to form the via hole 21, and the upper surface of the pad 12.

By forming the adhesion layer 15 by the NiCu alloy having the nitrogen content of 0.5 to 5.0 atoms %, the adhesiveness between the insulating layer 13 and the adhesion layer 15 is improved. Specifically, because peel strength of the adhesive layer 15 to the insulating layer 13 becomes 0.5 kgf/cm or more, the adhesion layer 15 can be prevented from being separated or exfoliated from the insulating layer 13.

It is preferable that the Ni content of the nitrided NiCu alloy of the adhesion layer 15 is set within a range, for example, from 20 wt % to 75 wt %. By setting a content of Ni in the nitrided NiCu alloy in the range from 20 wt % to 75 wt %, the adhesion layer 15 becomes hardly separable from the insulating layer 13, and an unnecessary portion of the adhesion layer 15 can be removed by using an etchant (for example, a solution of sulfuric acid system), which is used for removing an unnecessary portion of the seed layer 16. Thus, there is no need to remove an unnecessary portion of the seed layer 16 and an unnecessary portion of the adhesion layer 15 by using different etchants, thereby suppressing an increase in the manufacturing cost of the wiring board 10.

If the content of Ni in the nitrided NiCu alloy is set within the range from 20 wt % to 75 wt %, a thickness of the adhesion layer 15 formed of the nitrided NiCu alloy may be set to, for example, 30 nm to 100 nm.

The adhesion layer 15 is preferably formed by, for example, a sputtering method. By forming the adhesion layer 15 by using a sputtering method, the nitrogen content and the Ni content of the adhesion layer 15 (nitrided NiCu alloy) can be set to a desired ratio with high accuracy. For example, the above-mentioned ratio Ni:Cu=1:2 can be attained by setting the Ni content of an NiCu alloy target used in a sputtering method to 33 wt %.

Subsequently, in a seed layer forming process illustrated in FIG. 4, the seed layer 16 is formed to cover the upper surface of the adhesion layer 15. It is preferable to form the seed layer 16 by using a sputtering method. By forming the seed layer 16 using the sputtering method, the seed layer 16 can be formed using a sputtering apparatus, which is used to form the adhesion layer 15. For example, Cu may be used as a material of the seed layer 16. If the seed layer 16 is formed of Cu, a thickness of the seed layer 16 is preferably set within a range from 300 nm to 500 nm.

Figure 5:
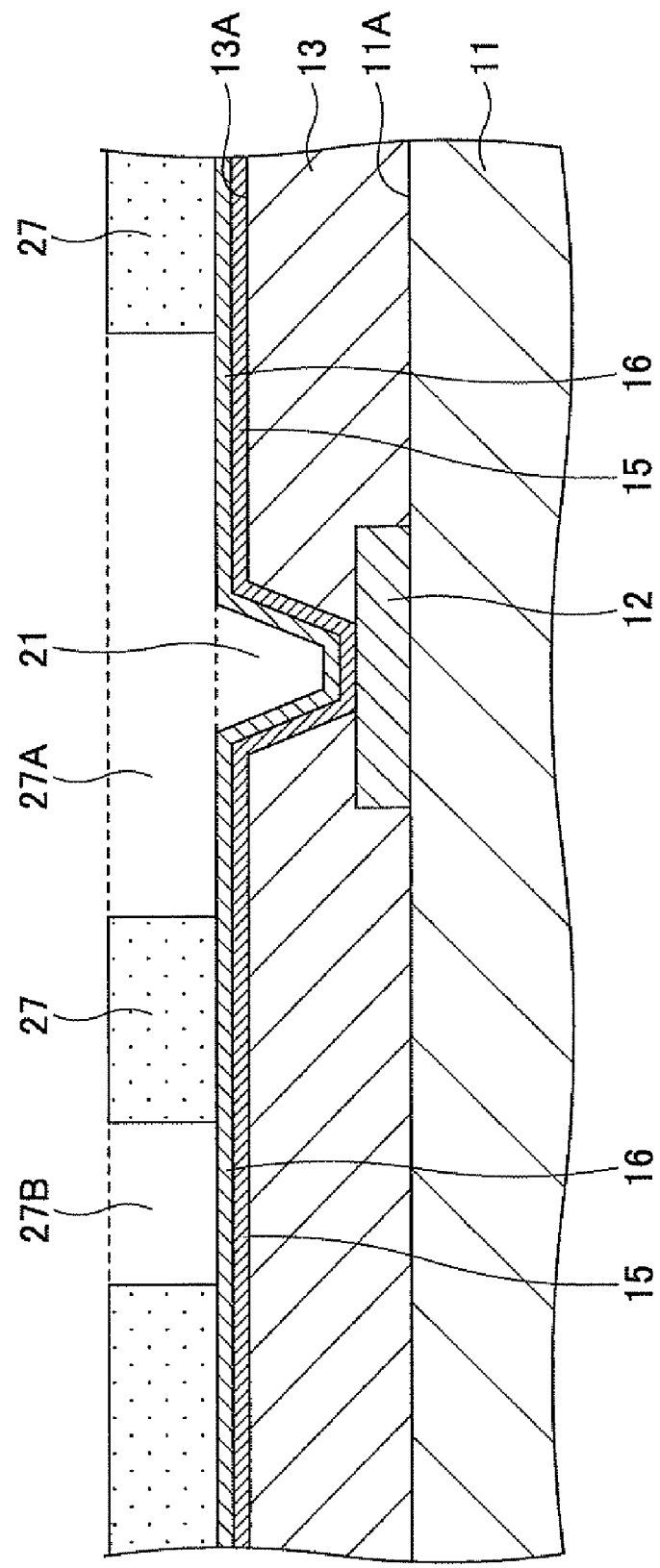
FIG. 5 is a cross-sectional view illustrating a resist film forming process.

Subsequently, in a resist film forming process illustrated in FIG. 5, a resist film 27 having opening parts 27A and 273 is formed on the top surface of the seed layer 16. The opening part 27A is formed so that a portion of the seed layer 16 corresponding to an area where the circuit pattern 18 is formed is exposed. The opening part 27B is formed so that a portion of the seed layer 16 corresponding to an area where the wiring 19 is formed is exposed. For example, it is preferable to set L/S of the resist film 27 to 12/12 μm, and set a thickness of the resist film 27 to 25 μm.

Subsequently, in a wiring and circuit pattern forming process illustrated in FIG. 6, the wiring 19 and the circuit pattern 18 having the via 23 and the wiring 24 are simultaneously formed by forming a plating film (for example, a Cu plating film) on the seed layer 16 exposed by the openings 27A and 27B. At this stage, the circuit pattern 18 is electrically connected to the wiring 19 through the adhesion layer 15 and the seed layer 16. The thickness of the wiring 19 and the wiring 24 is preferably set to 20 μm.

Figure 6:
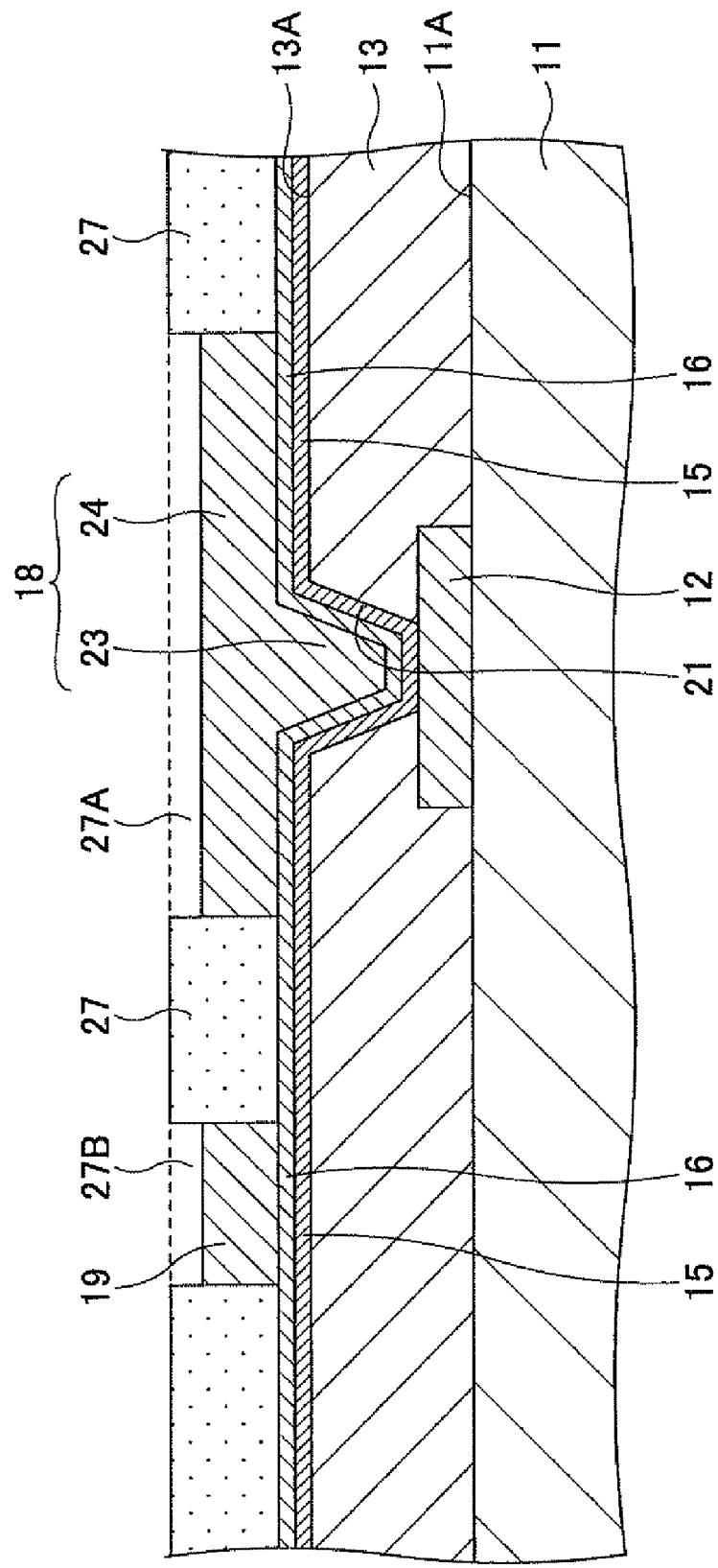
FIG. 6 is a cross-sectional view illustrating a wiring and wiring patter forming process.
Figure 7:
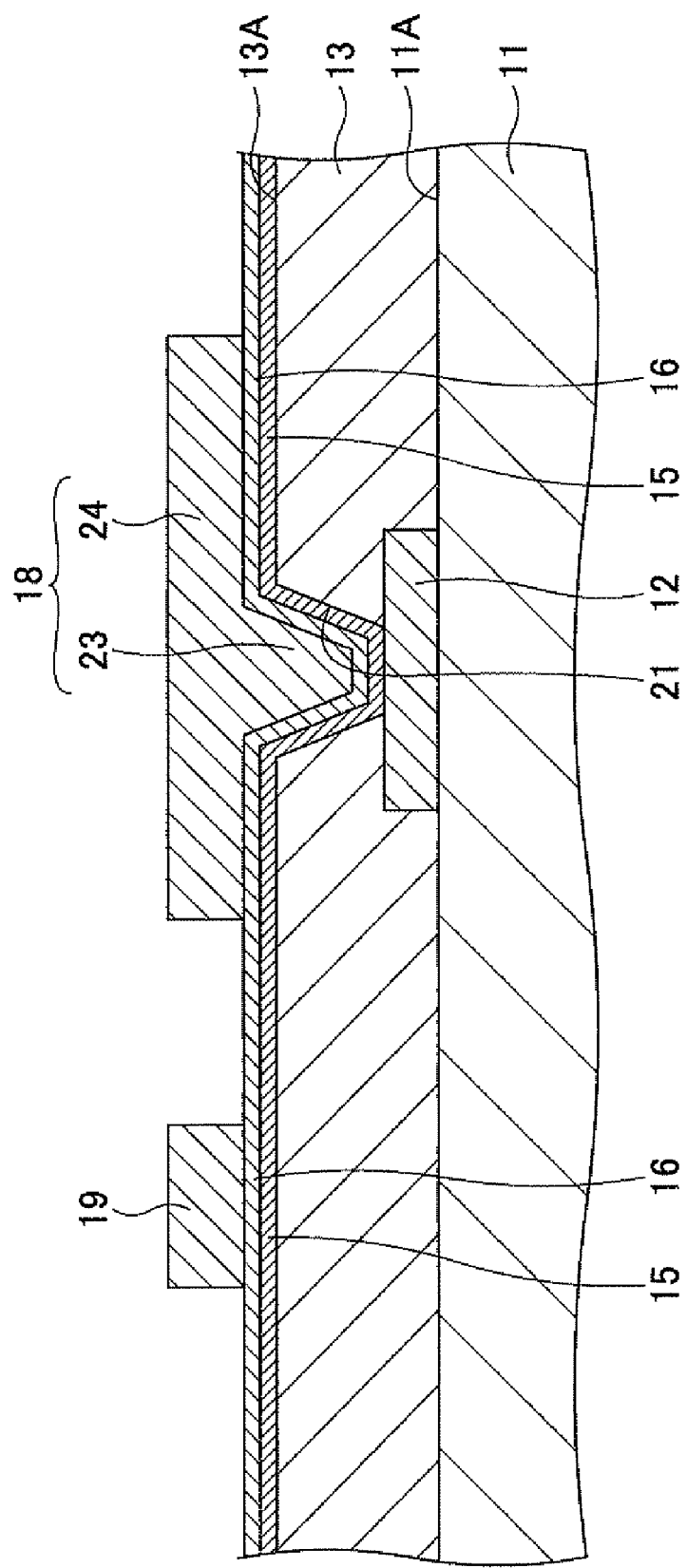
FIG. 7 is a cross-sectional view illustrating a resist film removing process.
Figure 8:
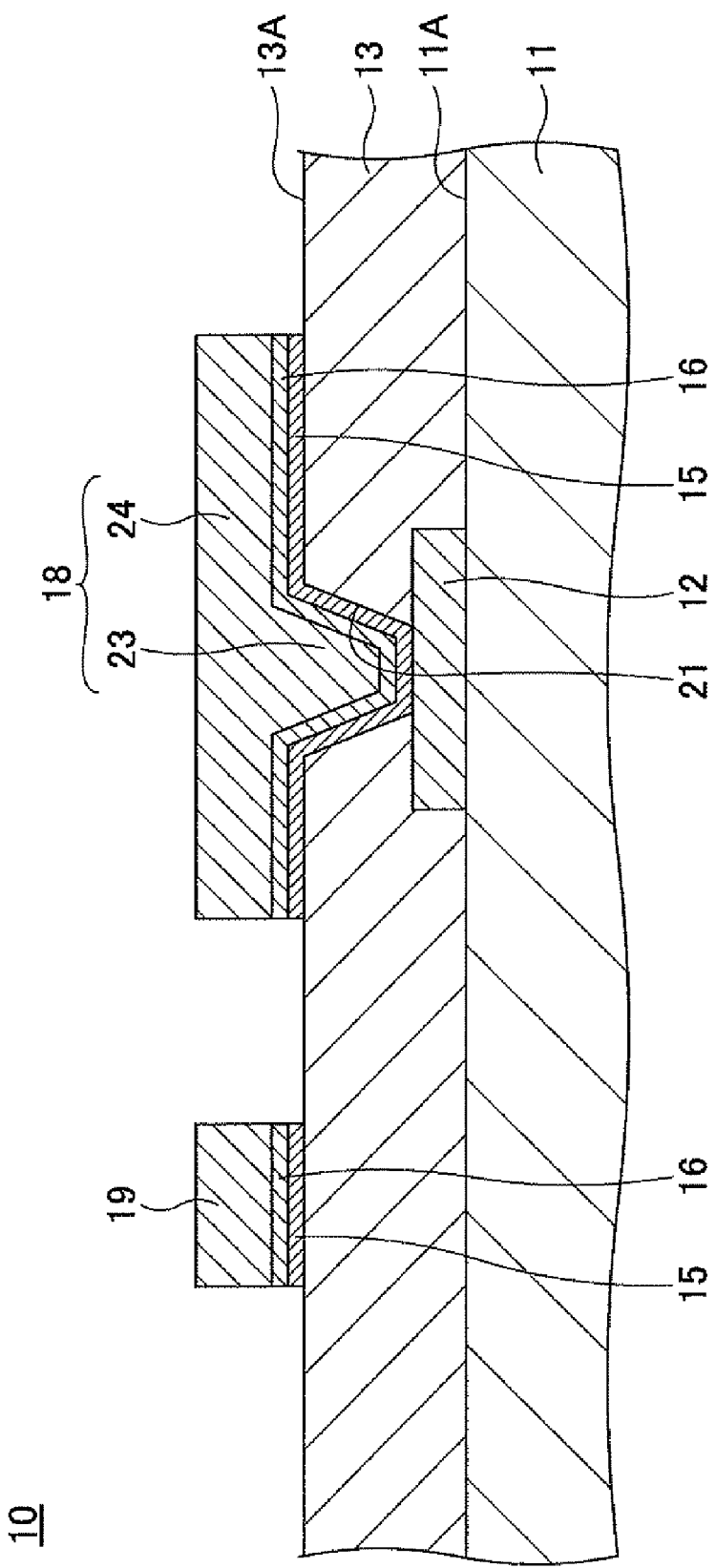
FIG. 8 is a cross-sectional view illustrating a seed layer and adhesion layer removing process.

Subsequently, in a resist film removing process illustrated in FIG. 7, the resist film illustrated in FIG. 6 is removed. Then, in a seed layer and adhesion layer removing process illustrated in FIG. 8, portions of the seed layer 16 and the adhesion layer 15 formed in areas other than the area where the circuit pattern 18 and the wiring 19 are formed are removed. That is, an unnecessary portion of the seed layer 16 and an unnecessary portion of the adhesion layer 15 are removed.

Specifically, when a Cu layer is used as the seed layer 16 and the Ni content of the adhesion layer 15 is set within a range from 20 wt % to 75 wt %, an unnecessary portion of the seed layer 16 and an unnecessary portion of the adhesion layer 15 are removed simultaneously by using a Cu etchant (for example, a solution of sulfuric acid system).

The wiring board 10 according to the present embodiment can be formed by performing the above-mentioned processes.

Figure 9:
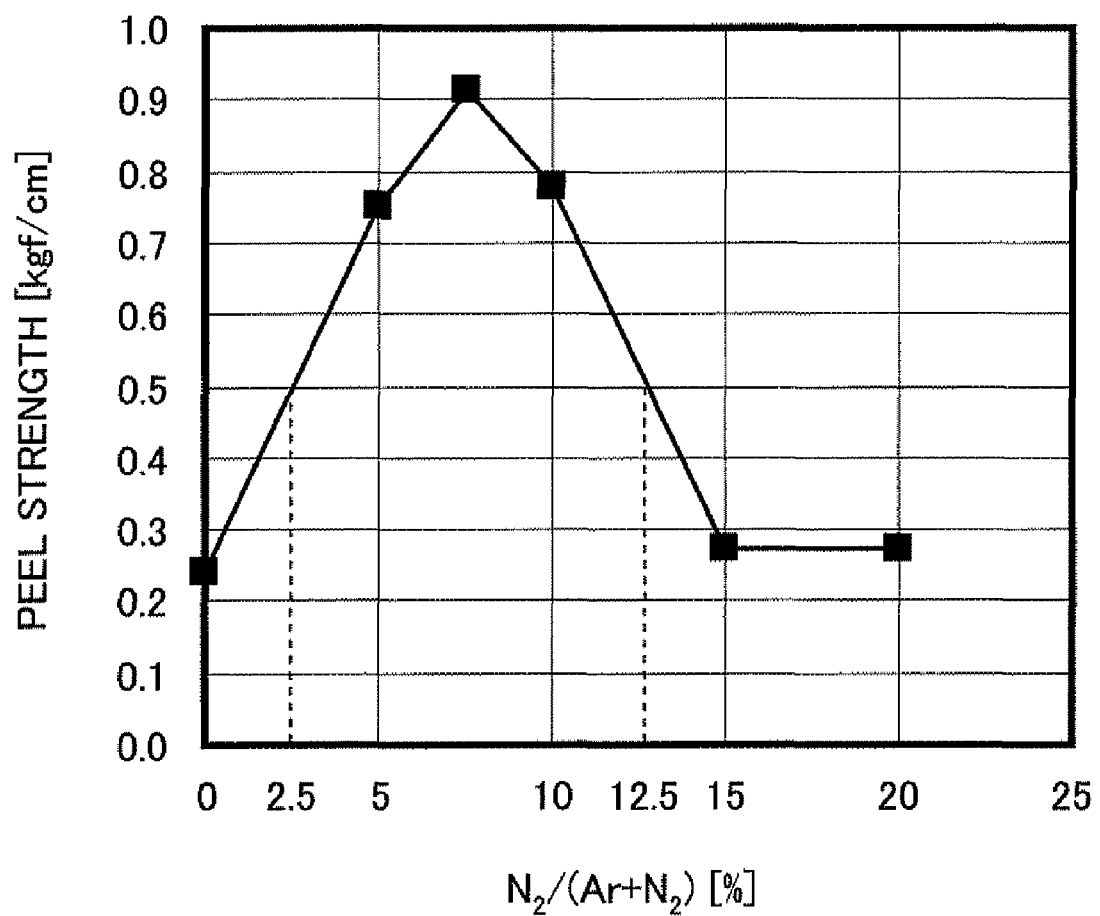
FIG. 9 is a graph indicating peel strength of the adhesion layer.

A description will be given below of results of experiments to check adhesiveness of the adhesion layer 15. The inventor formed the adhesion layer 15 on the insulating layer 13 by the above-mentioned manufacturing method, and carried out peel tests of the adhesion layer 15. Nitrogen gas was added to an Ar gas atmosphere when forming the adhesion layer 15 by a sputtering method in order to cause an NiCu alloy to contain nitrogen. Samples were fabricated while varying an amount of the nitrogen gas added to the Ar gas atmosphere from 0% to 20%, the thus-fabricated samples were subjected to the peel test. The peel strength was represented by a force (kgf/cm) necessary to peel or separate the adhesion layer 15 of a width of 1 cm from the insulating layer 13. FIG. 9 is a graph indicating the peel strength of the adhesion layer 15.

As interpreted from FIG. 9, the peel strength of the adhesion layer 15 when nitrogen gas was not added (0%) was 0.24 kgf/cm, which is a low value. When nitrogen gas was added to the Ar gas atmosphere, the peel strength increased, and the peel strength when nitrogen gas was added by 5% was raised to 0.76 kgf/cm. When nitrogen gas was added by 7.7%, the peel strength was 9.1 kgf/cm, which is the maximum peak value. When an amount of nitrogen gas was increased further, the peel strength decreased. When an amount of nitrogen gas added to the Ar gas atmosphere was increased to 15%, the peel strength was decreased to 0.28 kgf/cm.

As a result of investigation of the peel strength at which a separation of the adhesion layer does not occur in actual products, it was found that separation of the adhesion layer hardly occurs if the peel strength is 0.5 kgf/cm or more, which provides no problem in practice. From the graph of FIG. 9, it was found that the peel strength is 0.5 kgf/cm or more if an amount of nitrogen gas added to the Ar gas atmosphere is in a range from 2.5% to 12.5%. Thus, the inventor investigated a nitrogen content of the nitrided NiCu alloy formed as the adhesion layer 15 when the amount of nitrogen gas added to the Ar gas atmosphere was varied from 2.5% to 12.5%.

Figure 10:
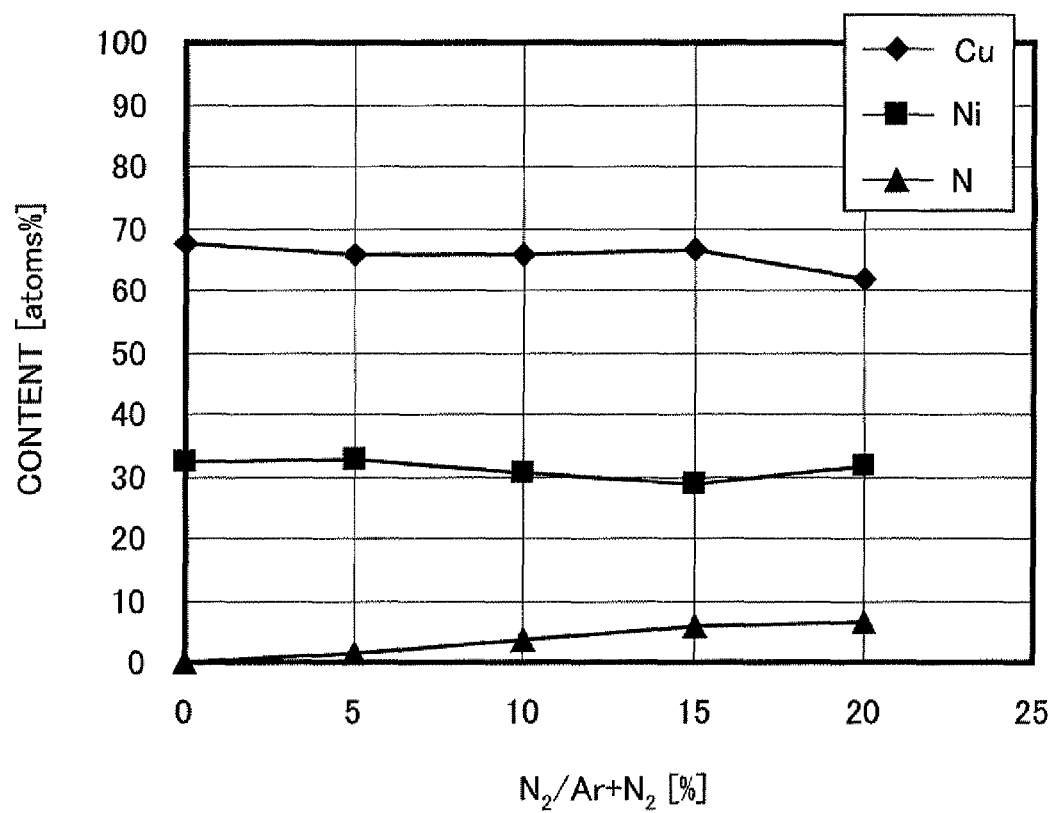
FIG. 10 is a graph indicating content of N, Ni and Cu of a nitrided NiCu alloy.

FIG. 10 is a graph indicating a composition of a nitrided NiCu alloy when the nitrided NiCu alloy was formed by a sputtering method while varying an amount of nitrogen gas added to the Ar gas atmosphere. When the amount of nitrogen gas added to the Ar gas atmosphere was 0% (that is, nitrogen gas is not added), an amount of Ni in the NiCu alloy was 32 atoms % and an amount of Cu was 68 atoms %. When nitrogen gas was added to the Ar gas atmosphere, an NiCu alloy containing nitrogen, that is, a nitrided NiCu alloy was formed. When an amount of nitrogen gas was increased, an amount of nitrogen contained in the nitrided NiCu alloy was also increase.

Figure 11:
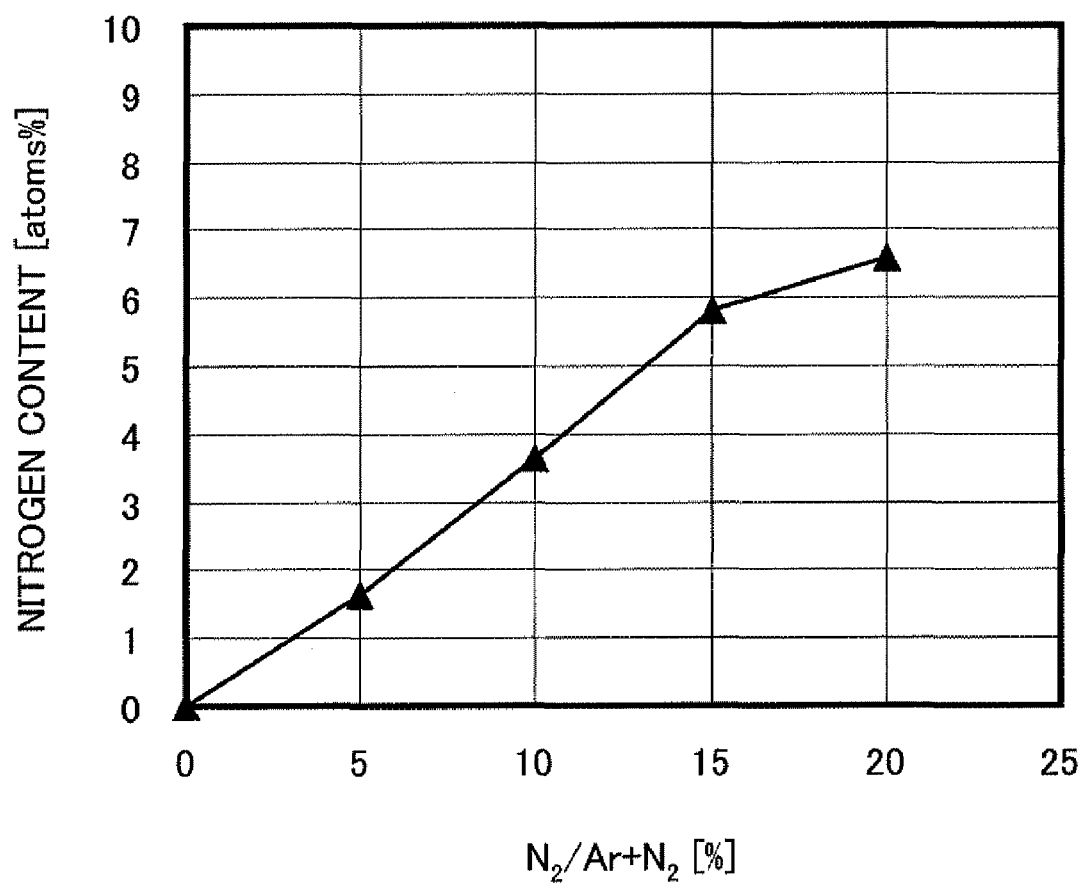
FIG. 11 is a graph indicating content of $N_2$ in the nitrided NiCu alloy.

FIG. 11 is a graph indicating a change in the nitrogen content of FIG. 10 with an enlarged scale of the vertical axis. FIG. 11 clearly indicates a change in the nitrogen content. That is, FIG. 11 is a graph indicating the nitrogen content in the nitrided NiCu alloy when the nitrided NiCu alloy was formed by a sputtering method while varying an amount of nitrogen gas added to the Ar gas atmosphere. It was found from the graph of FIG. 11 that the nitrogen content of the nitrided NiCu alloy when an amount of nitrogen gas added to the Ar gas atmosphere was varied from 2.5% to 12.5% was equal to or greater than 1 atoms % and equal to or less than 5 atoms % (from 1 atoms % to 5 atoms %). Accordingly, it was found that if the nitrogen content of the nitrided NiCu alloy is in the range from 1 atoms % to 5 atoms %, the peel strength of the adhesion layer 15 formed of a nitrided NiCu alloy is 0.5 kgf/cm or more. That is, by setting the nitrogen content of the nitrided NiCu alloy to a value within the range from 1 atoms % to 5 atoms %, the peel strength of the adhesion layer 15 can be 0.5 kgf/cm or more, thereby surely preventing separation or exfoliation of the adhesion layer 15.

Although the Cu wiring is formed by an additive method in the above-mentioned manufacturing method of the wiring board 10, the Cu wiring may be formed by using a subtractive method or a damascene method.

FIG. 12 through FIG. 17 are cross-sectional views illustrating a process of forming a Cu wiring on the substrate via the adhesion layer by a subtractive method. In FIG. 12 through FIG. 17, parts that are the same as the parts illustrated in FIG. 2 through FIG. 8 are given the same reference numerals.

Figure 4:
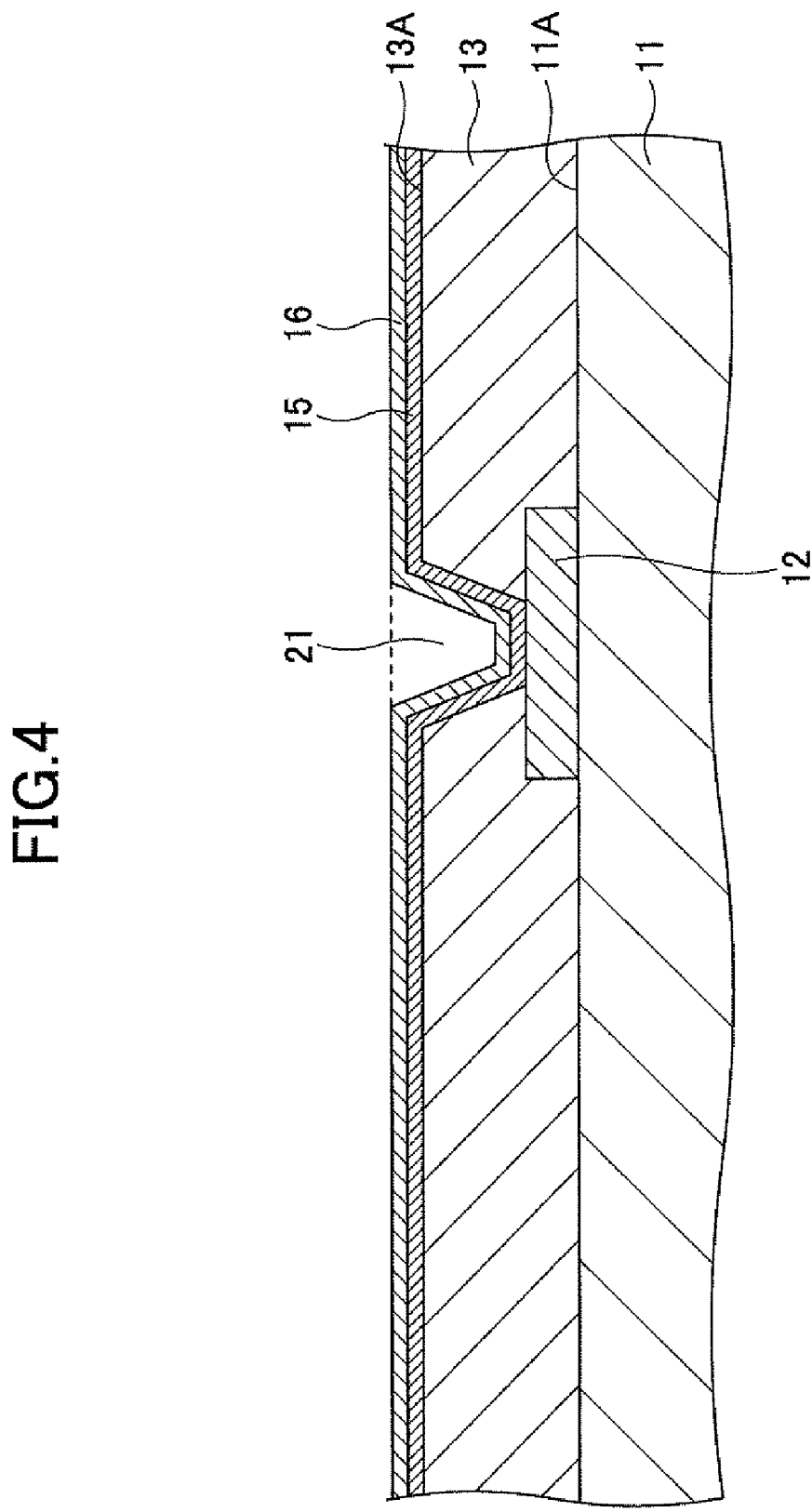
FIG. 4 is a cross-sectional view illustrating a seed layer forming process.
Figure 12:
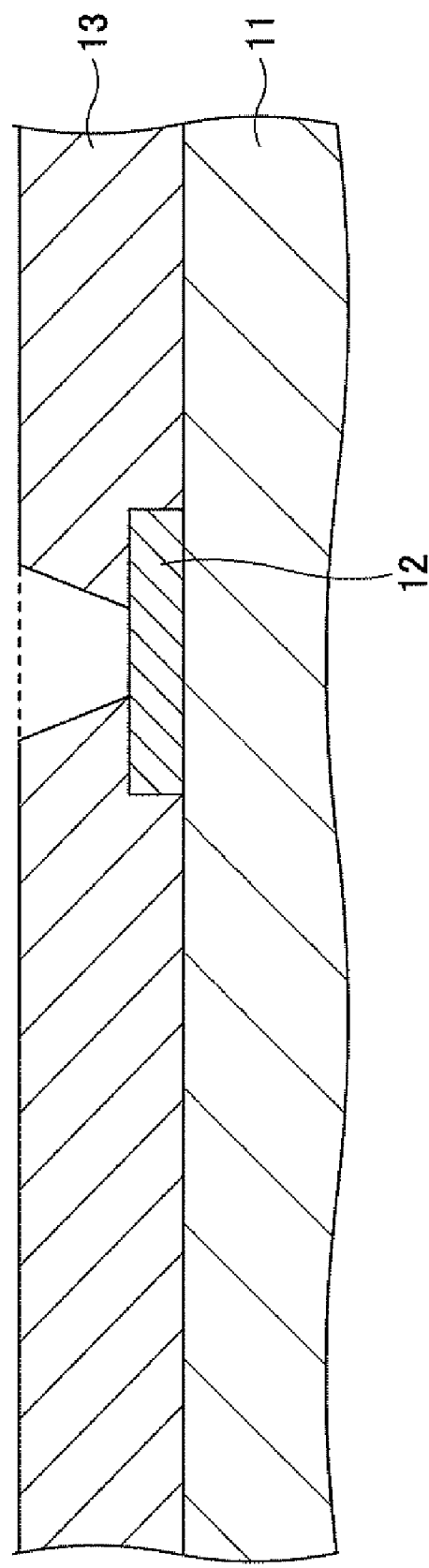
FIG. 12 is a cross-sectional view illustrating a process of preparing a substrate in a process of forming wiring by a subtractive method.
Figure 13:
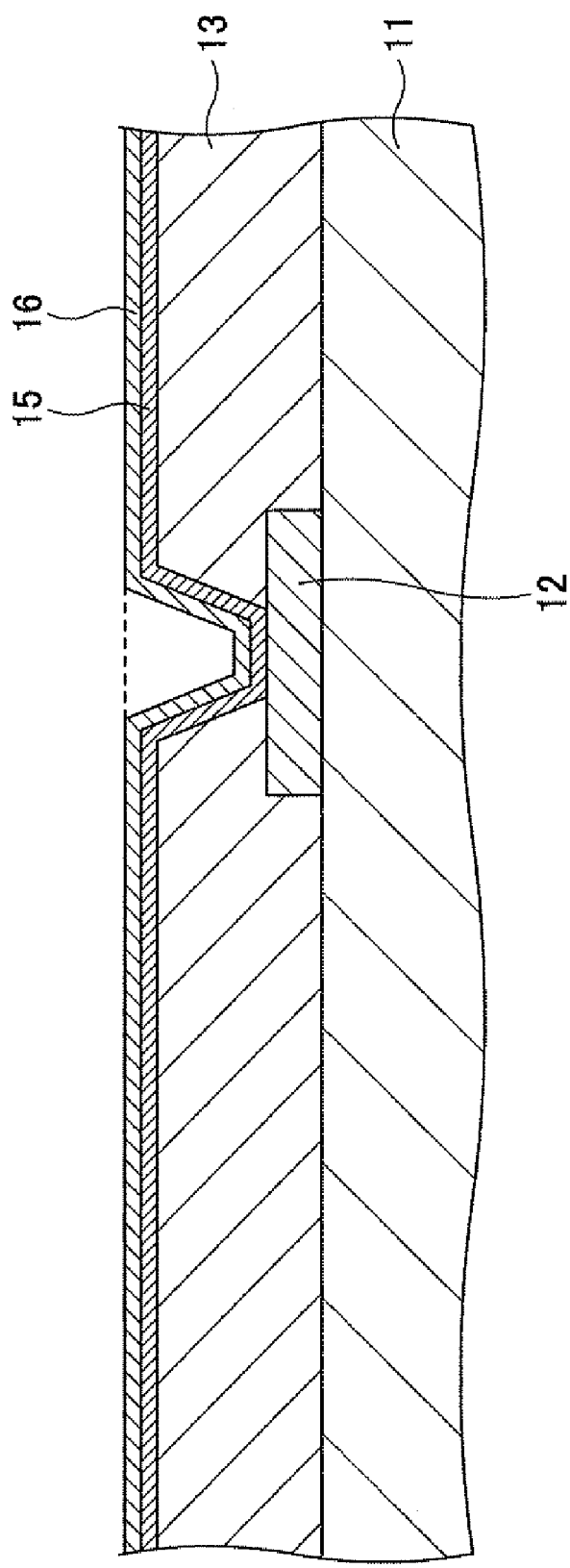
FIG. 13 is a cross-sectional view illustrating a process of forming an adhesion layer and a seed layer in a process of forming wiring by a subtractive method.
Figure 14:
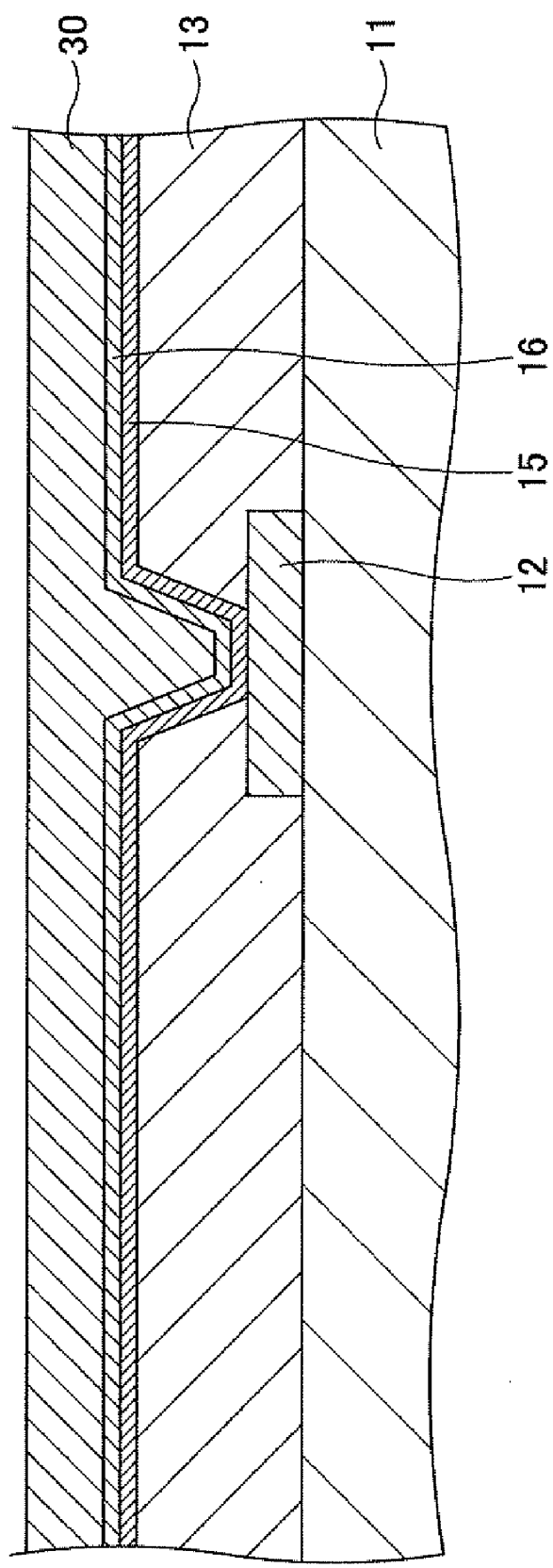
FIG. 14 is a cross-sectional view illustrating a process of forming a Cu plating layer in a process of forming wiring by a subtractive method.

In a process illustrated in FIGS. 12 and 13, a process of forming the adhesion layer 15 and the seed layer 16 on the insulating layer 13 is the same as that illustrated in FIGS. 2 through 4, and descriptions thereof will be omitted. The adhesion layer 15 is formed by a nitrided NiCu alloy as mentioned above. In a subtractive method, a Cu plating layer 30 is formed on an entire surface of the seed layer 16 by an electroplating method after forming the adhesion layer 15 and the seed layer 16 on the insulating layer 13. A part of the Cu plating layer 30 serves as the circuit pattern 18 and the wiring 19.

Figure 15:
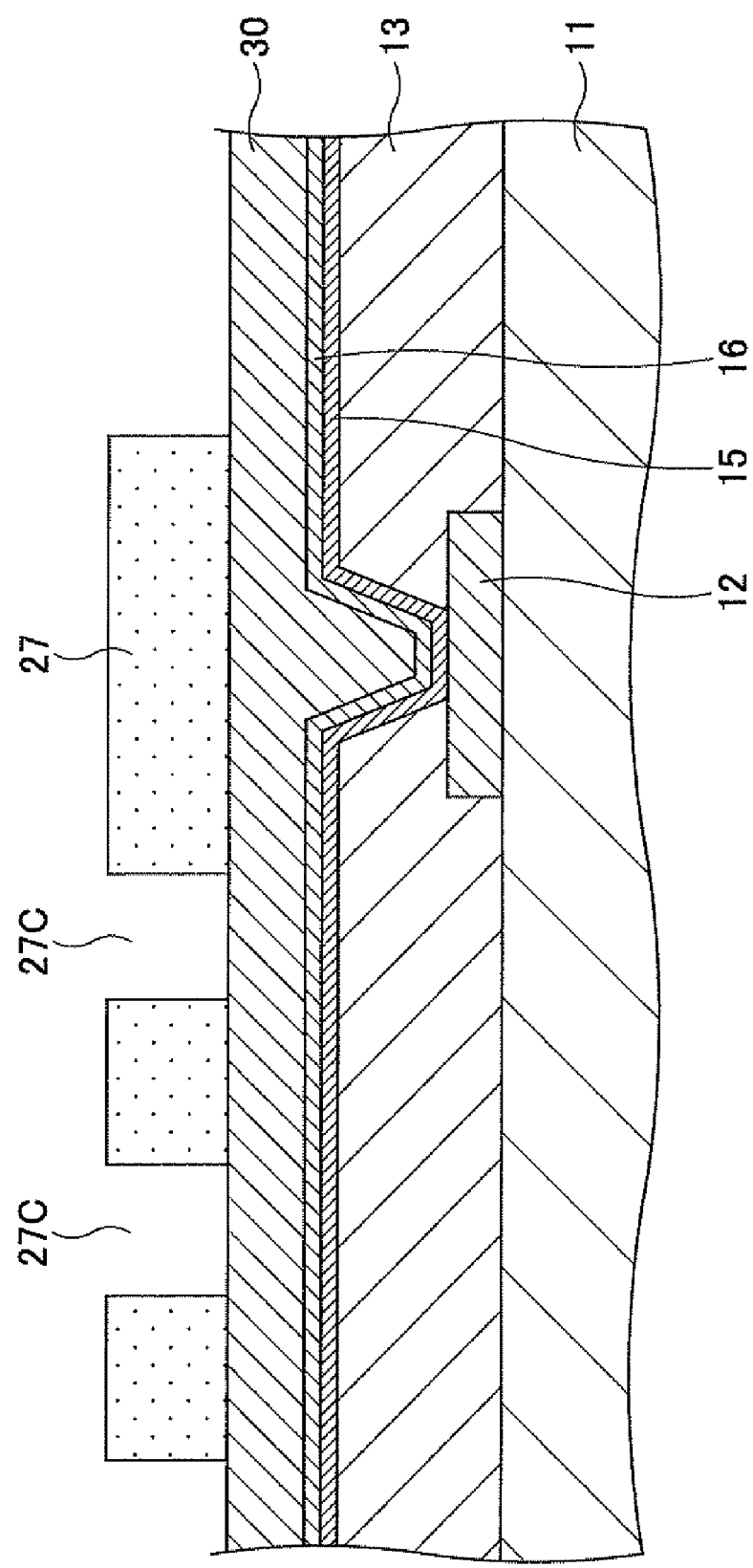
FIG. 15 is a cross-sectional view illustrating a process of forming a resist film in a process of forming wiring by a subtractive method.

After forming the Cu plating layer 30, a resist 27 is formed on the Cu plating layer 30 in a resist pattering process illustrated in FIG. 15 and an opening 27C is formed in the resist 27. The opening 27C is formed so that the Cu plating layer 30 is exposed in an area other than the area where the circuit pattern 18 and the wiring 19 are formed.

Figure 16:
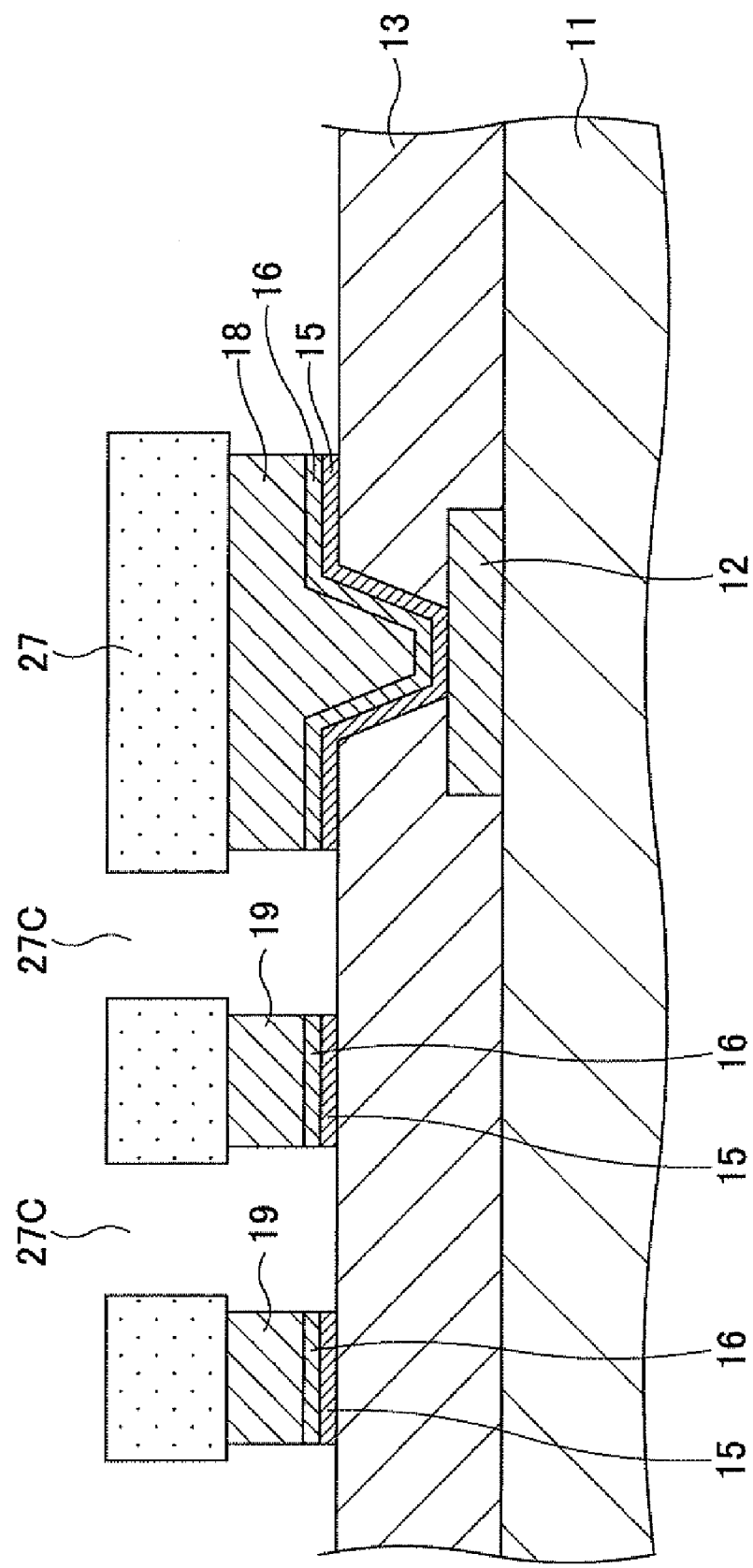
FIG. 16 is a cross-sectional view illustrating a process of removing an unnecessary portion of a Cu plating layer in a process of forming wiring by a subtractive method.
Figure 17:
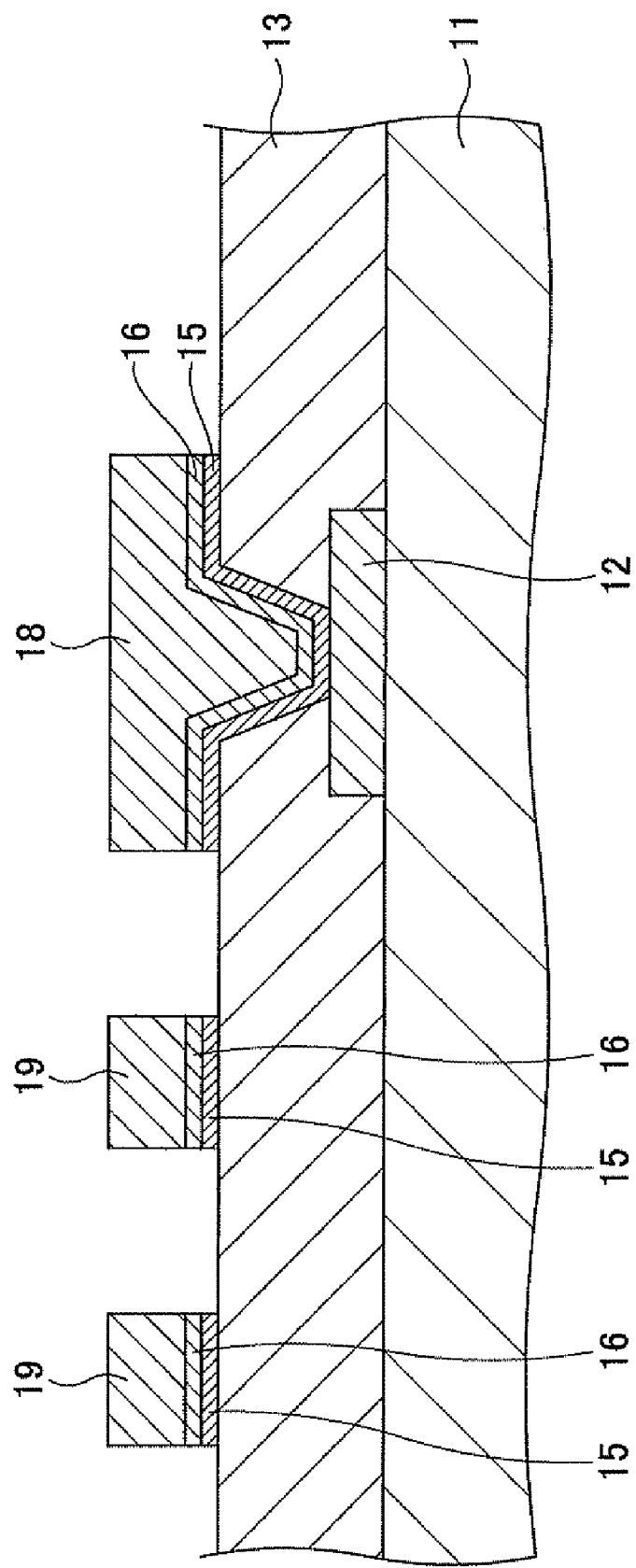
FIG. 17 is a cross-sectional view illustrating a process of removing a resist film in a process of forming wiring by a subtractive method.

Then, in a plating layer removing process illustrated in FIG. 16, the Cu plating layer 30 exposed in the opening 27C is removed by etching. For example, a copper chloride solution is used as an etchant. In this etching, the seed layer 16 and the adhesion layer 15 located under the Cu plating layer 30 can be removed simultaneously by the etching. A portion of the Cu plating layer 30 covered by the resist 27 remains, which portion serves as the circuit pattern 18 and the wiring 19. Then, the resist 27 is removed in a resist removing process illustrated in FIG. 17, and the wiring board 10 having the circuit pattern 18 and the wiring 19 is completed.

FIG. 18 through FIG. 21 are cross-sectional views illustrating a process of forming a Cu wiring on a substrate via an adhesion layer by a dual damascene method. In FIG. 18 through FIG. 21, parts that are the same as the parts illustrated in FIG. 2 through FIG. 8 are given the same reference numerals.

Figure 18:
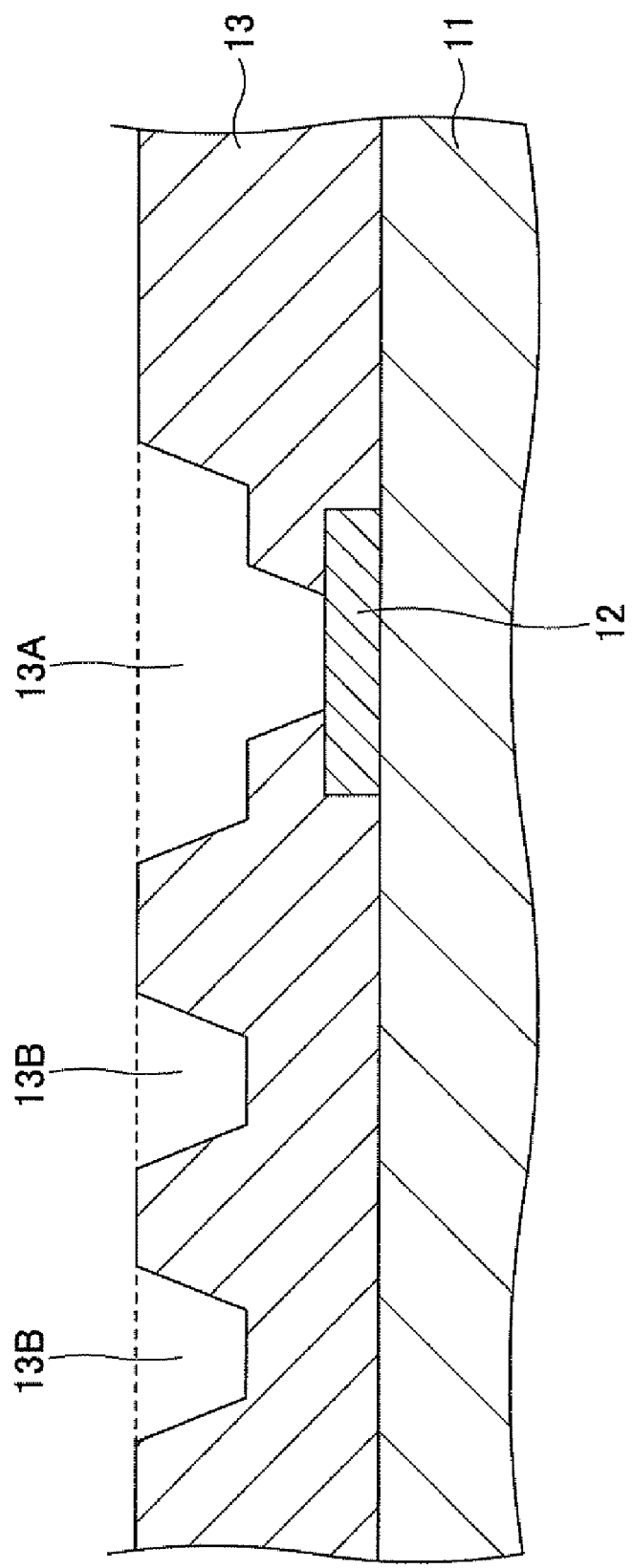
FIG. 18 is a cross-sectional view illustrating a process of forming a substrate in a process of forming wiring by a dual damascene method.

In FIG. 18, a process of forming the adhesion layer 15 and the seed layer 16 on the insulating layer 13 is the same as that illustrated in FIG. 2 through FIG. 4, and descriptions thereof will be omitted. According to the dual damascene method, wiring grooves 13A and 13B are formed in an area of the insulating layer 13 where the circuit pattern 18 and the wiring 19 are to be formed. The wiring groove 13A corresponds to an area where the circuit pattern 18 is formed, and the wiring groove 13B corresponds to an area where the wiring 19 is formed.

Figure 19:
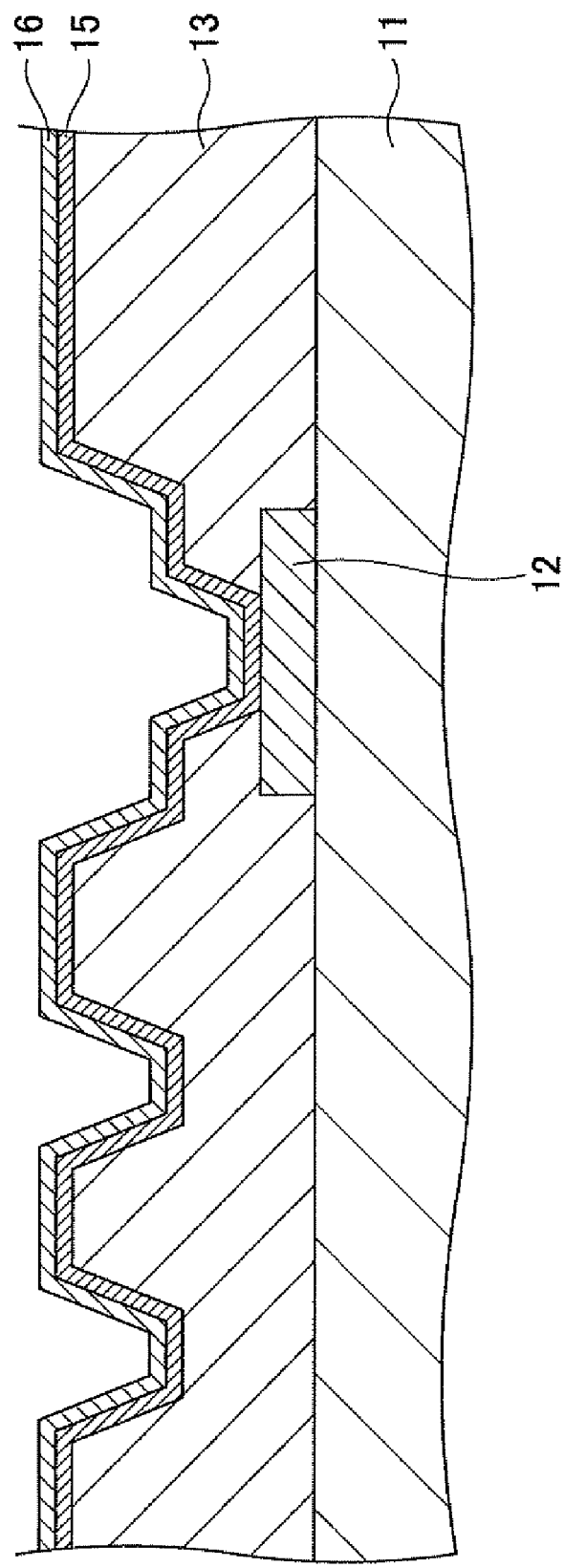
FIG. 19 is a cross-sectional view illustrating a process of forming an adhesion layer and a seed layer in a process of forming wiring by a dual damascene method.
Figure 20:
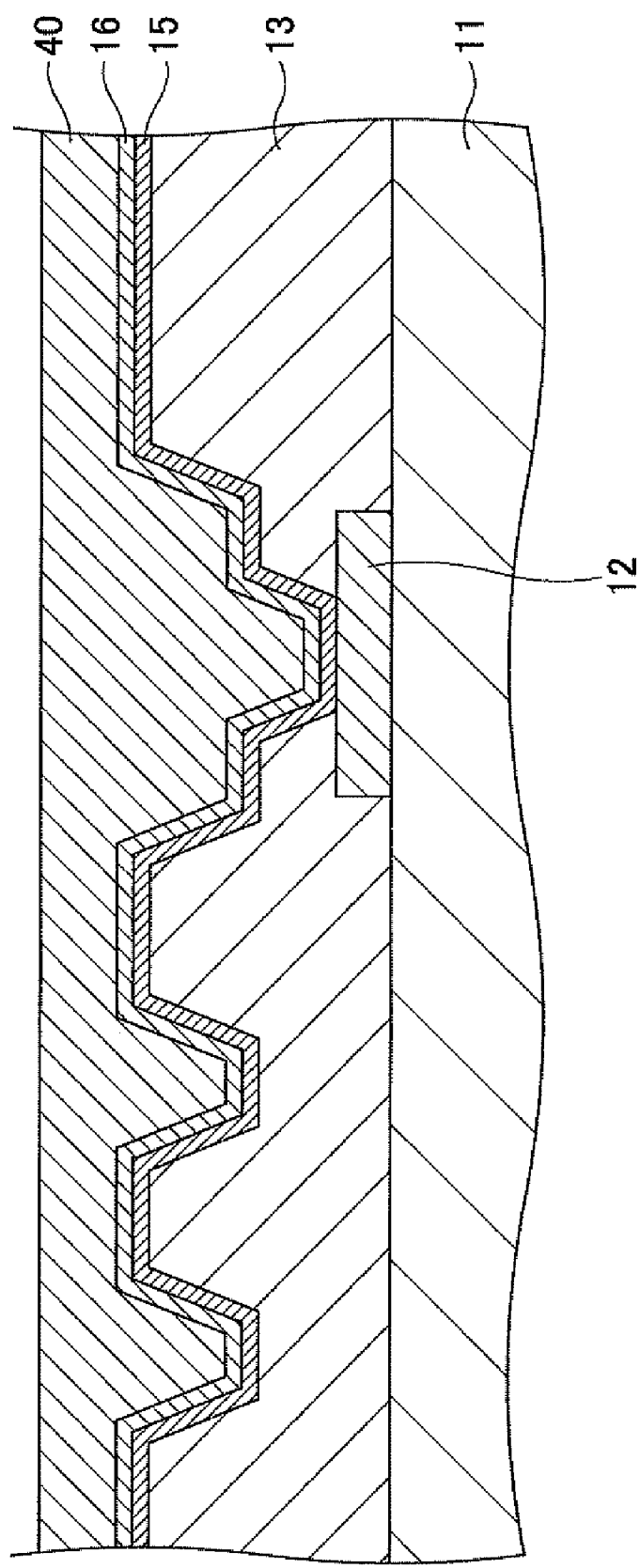
FIG. 20 is a cross-sectional view illustrating a process of forming a Cu plating layer in a process of forming wiring by a dual damascene method.
Figure 21:
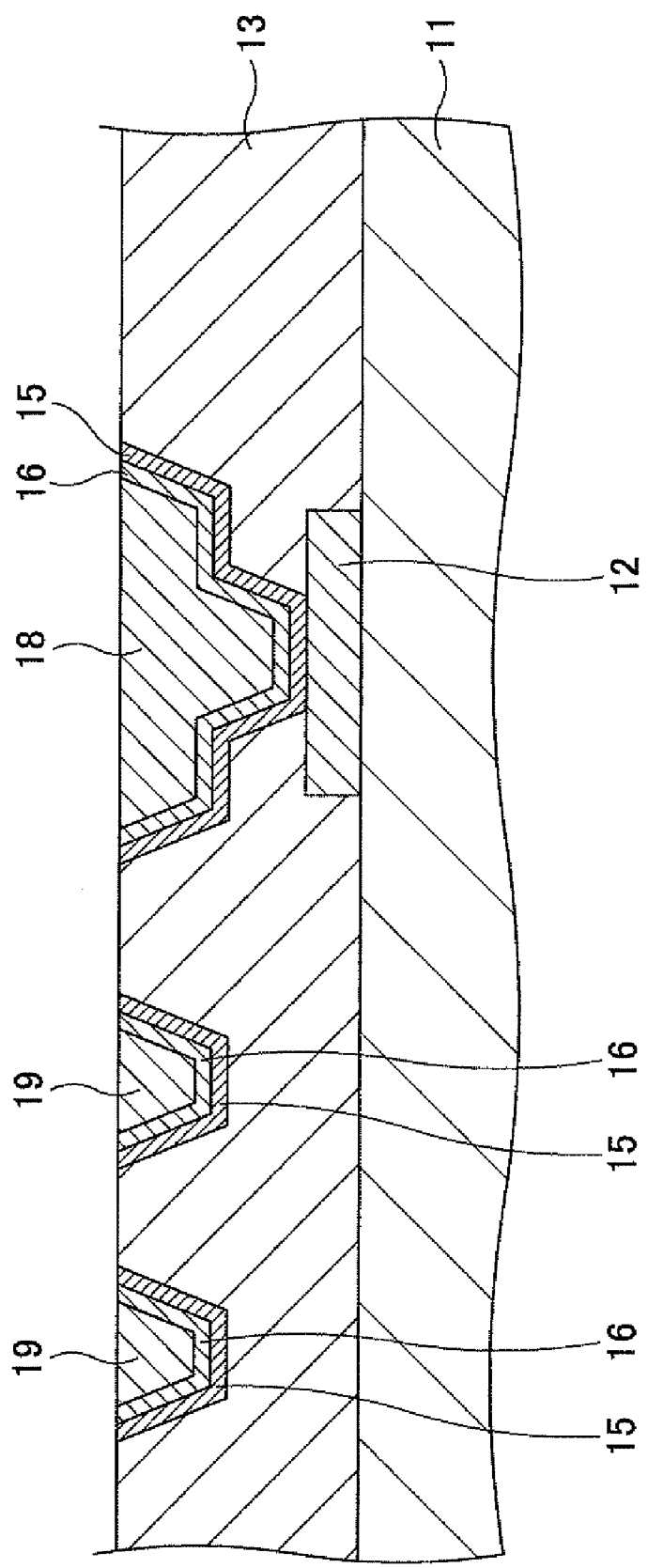
FIG. 21 is a cross-sectional view illustrating a process of removing an unnecessary portion of a Cu plating layer in a process of forming wiring by a dual damascene method.

Then, as illustrated in FIG. 19, the adhesion layer 15 made of a nitrided NiCu alloy film and the seed layer 16 are formed on the surface of the insulating layer 13 including inner surfaces of the wiring grooves 13A and 13B. Then, as illustrated in FIG. 20, a Cu plating layer 40 is formed on the seed layer 16 by an electroplating method to fill the Cu plating layer 40 in the wiring grooves 13A and 13B. Then, as illustrated in FIG. 21, the Cu plating layer 40 formed on the surface of the insulating layer 13 is removed by chemical mechanical polishing (CMP), and the seed layer 16 and the adhesion layer 15 are removed. Thereby, the Cu plating layer 40 remains in the wiring grooves 13A and 13B, and the Cu plating layer 40 in the wiring grooves 13A and 13B serves as the circuit pattern 18 and the wiring 19.

According to the wiring board and the manufacturing method according to the present embodiment, the peel strength of the adhesion layer 15 to the insulating layer 13 can be made larger than that of an adhesion layer formed of an NiCu alloy containing no nitrogen, by forming the NiCu alloy layer containing nitrogen as the adhesion layer 15 arranged between the insulating layer 13 and the seed layer 16. For example, in a case where a Cu layer is used as the seed layer 16, an unnecessary portion of the seed layer 16 and an unnecessary portion of the adhesion layer 15 can be removed in the same etching process using a Cu etchant (for example, a liquid for etching Cu) by setting the nitrogen content of the adhesion layer 15 within the range from 20 wt % to 75 wt %. Thereby, an increase in the manufacturing cost of the wiring board 10 can be suppressed.

All examples and conditional language recited herein are intended for pedagogical purposes to aid the reader in understanding the principles of the invention and the concepts contributed by the inventor to furthering the art, and are to be construed a being without limitation to such specifically recited examples and conditions, nor does the organization of such examples in the specification relates to a showing of the superiority and inferiority of the invention. Although the embodiment(s) of the present invention (s) has(have) been described in detail, it should be understood that the various changes, substitutions, and alterations could be made hereto without departing from the spirit and scope of the invention.

What is claimed is:

1. A wiring board comprising:
   a substrate;
   an adhesion layer formed on said substrate; and
   a wiring layer formed on said adhesion layer,
   wherein said adhesion layer is formed by a nitrided NiCu alloy. and a nitrogen content of said nitrided NiCu alloy is within a range from 1 atoms % to 5 atoms %.

2. The wiring board as claimed in claim 1, wherein said wiring layer includes a seed layer formed on said adhesion layer.

3. The wiring board as claimed in claim 2, wherein said seed layer is formed by Cu, and a content of Ni in said adhesion layer is within a range from 20 wt % to 75 wt %.

4. The wiring board as claimed in claim 1, wherein said substrate includes a substrate body and a resin insulating layer formed on a surface of said substrate body.

5. A wiring board comprising:
a substrate;
an adhesion layer formed on said substrate; and
a wiring layer formed on said adhesion layer,
wherein said adhesion layer is formed by a nitrided NiCu alloy, a nitrogen content of said nitrided NiCu alloy is within a range from 1 atoms % to 5 atoms %, and a weight ratio of Ni and Cu in the nitrided NiCu alloy is 1:2.

* * * * *